(12) United States Patent
Kim (10) Patent No.: US 11,214,869 B2
(45) Date of Patent: Jan. 4, 2022

(54) HEAT TREATMENT APPARATUS FOR HIGH-QUALITY GRAPHENE SYNTHESIS

(71) Applicant: CHARMTRON CO., LTD., Yongin-si (KR)

(72) Inventor: Yong Ki Kim, Hwaseong-si (KR)

(73) Assignee: CHARMTRON CO., LTD., Yongin-si (KR)

( * ) Notice: Subject to any disclaimer, the term of this patent is extended or adjusted under 35 U.S.C. 154(b) by 309 days.

(21) Appl. No.: 16/099,075

(22) PCT Filed: Jun. 21, 2017

(86) PCT No.: PCT/KR2017/006494
§ 371 (c)(1),
(2) Date: Nov. 5, 2018

(87) PCT Pub. No.: WO2018/016746
PCT Pub. Date: Jan. 25, 2018

(65) Prior Publication Data
US 2019/0194811 A1 Jun. 27, 2019

(30) Foreign Application Priority Data

Jul. 20, 2016 (KR) .......................... 10-2016-0092236

(51) Int. Cl.
*C23C 16/46* (2006.01)
*B65H 23/26* (2006.01)
(Continued)

(52) U.S. Cl.
CPC ............. *C23C 16/463* (2013.01); *B01J 35/02* (2013.01); *B01J 35/06* (2013.01); *B65H 18/08* (2013.01);
(Continued)

(58) Field of Classification Search
CPC ....... C23C 16/463; C23C 16/26; C23C 16/46; C23C 16/54; C23C 16/545; C23C 14/26;
(Continued)

(56) References Cited

U.S. PATENT DOCUMENTS 9,359,212 B2 * 6/2016 Chiba ........................ C23F 1/18
9,840,757 B2 * 12/2017 Chiba ........................ C22F 1/08
(Continued)

FOREIGN PATENT DOCUMENTS

GB 2534192 A * 7/2016 ............ C23C 16/46
KR 10-2011-0092207 A 8/2011
(Continued)

*Primary Examiner* — Dana Ross
*Assistant Examiner* — Adam Michael Eckardt
(74) *Attorney, Agent, or Firm* — Rabin & Berdo, P.C.

(57) ABSTRACT

A heat treatment apparatus for high-quality graphene synthesis comprises an upper roll chamber, a deposition chamber connected to the upper roll chamber to deposit graphene on a catalytic metal film, and a lower roll chamber mounted on a lower portion of the deposition chamber. The upper roll chamber includes a supply roller and the lower roll chamber includes a lower direction shifting roller shifting a direction of the catalytic metal film supplied from the supply roller. In the deposition chamber, a catalytic metal film at a supply side transferred from the supply roller to the lower direction shifting roller and a catalytic metal film at a discharge side transferred from the lower direction shifting roller to a winding roller are passed, and a heater portion is mounted around the catalytic metal film at the supply side and the catalytic metal film at the discharge side.

4 Claims, 7 Drawing Sheets

(51) Int. Cl.
- *C23C 16/26* (2006.01)
- *B01J 35/06* (2006.01)
- *B65H 37/00* (2006.01)
- *B65H 18/08* (2006.01)
- *C23C 16/54* (2006.01)
- *C01B 32/186* (2017.01)
- *B01J 35/02* (2006.01)
- *B65H 18/14* (2006.01)
- *B65H 18/16* (2006.01)

(52) U.S. Cl.
CPC ........... *B65H 18/145* (2013.01); *B65H 18/16* (2013.01); *B65H 23/26* (2013.01); *B65H 37/00* (2013.01); *C01B 32/186* (2017.08); *C23C 16/26* (2013.01); *C23C 16/46* (2013.01); *C23C 16/54* (2013.01); *C23C 16/545* (2013.01); *B65H 2301/4146* (2013.01)

(58) Field of Classification Search
CPC ......... C01B 32/186; B01J 35/02; B01J 35/06; B65H 18/08; B65H 18/145; B65H 18/16; B65H 23/26; B65H 37/00; B65H 2301/4146

See application file for complete search history.

(56) References Cited

U.S. PATENT DOCUMENTS

| | | | |
|---|---|---|---|
| 10,480,075 B2* | 11/2019 | Won | C23C 16/545 |
| 10,506,700 B2* | 12/2019 | Suzuki | C23C 16/545 |
| 10,597,782 B2* | 3/2020 | Buet | C23C 16/4412 |
| 2011/0195207 A1 | 8/2011 | Hong et al. | |
| 2012/0034150 A1* | 2/2012 | Noyes | B01J 23/745 |
| | | | 423/447.2 |
| 2014/0037963 A1* | 2/2014 | Song | B82Y 30/00 |
| | | | 428/408 |
| 2015/0010701 A1* | 1/2015 | Hong | C23C 16/545 |
| | | | 427/178 |
| 2015/0110960 A1* | 4/2015 | Sauer | B05D 1/60 |
| | | | 427/294 |
| 2016/0068397 A1* | 3/2016 | Su | C23C 16/26 |
| | | | 427/577 |
| 2016/0372351 A1* | 12/2016 | Singh | H01L 21/6719 |
| 2017/0016111 A1* | 1/2017 | Dijon | C23C 16/26 |

FOREIGN PATENT DOCUMENTS

| | | |
|---|---|---|
| KR | 10-2012-0061224 A | 6/2012 |
| KR | 10-2012-0111659 A | 10/2012 |
| KR | 10-2014-0071551 A | 6/2014 |
| KR | 10-2015-0077050 A | 7/2015 |

* cited by examiner

HEAT TREATMENT APPARATUS FOR HIGH-QUALITY GRAPHENE SYNTHESIS

TECHNICAL FIELD

The present invention relates to a heat treatment apparatus for high-quality graphene synthesis, and more particularly, to a heat treatment apparatus for high-quality graphene synthesis capable of more effectively depositing graphene on a catalytic metal film.

BACKGROUND ART

Generally, graphene is a material having a two-dimensional planar structure having a honeycomb shape in which carbons are connected with each other in the form of a hexagonal shape, and has a very large feature that its thickness is very thin and transparent, and electric conductivity is very high. Attempts have been made to apply the graphene to a transparent display or a flexible display using these features.

A conventional method for manufacturing a graphene film is described in Korean Patent Publication No. 10-2012-0111659 (Method for manufacturing film including graphene, published on Oct. 10, 2012).

In the above publication patent, for mass production, there are disclosed steps of forming the graphene by transferring a catalytic metal film in one direction by a roll-to-roll method for mass production and forming a transfer film on one surface of the catalytic metal film in which the graphene not formed, and a mechanical configuration required for each step has been described.

Particularly, there are disclosed a winding roller and a transfer roller for winding and transferring the catalytic metal film, a graphene formation space of depositing the graphene by supplying carbon supply gas to the catalytic metal film, and the like.

However, the graphene is manufactured by using chemical vapor deposition (CVD), thermochemical vapor deposition (TCVD), rapid thermal chemical vapor deposition (RT-CVD) and the like, and in order to enable continuous graphene manufacturing while the catalytic metal film passes through the graphene formation space, a vacuum state of the graphene formation space needs to be maintained, but such a technical configuration is not mentioned in the above publication patent.

When such a device is used, it is difficult to form the graphene formed by CVD and it is possible to sufficiently predict a problem that process defects occur due to the penetration of foreign materials. Further, a deposition chamber is horizontally placed and there is a possibility to generate damage to the graphene deposited on the catalytic metal film in the deposition chamber.

DISCLOSURE

Technical Problem

An object of the present invention to consider the above problems is to provide a configuration of a heat treatment apparatus for high-quality graphene analysis capable of enhancing deposition efficiency of graphene in an apparatus for manufacturing a graphene film by a roll-to-roll method.

Another object of the present invention is to provide a configuration of a heat treatment apparatus for high-quality graphene analysis capable of efficiently using supplied heat while preventing damage to deposited graphene.

Technical Solution

An embodiment of the present invention to solve the problem provides a heat treatment apparatus for high-quality graphene synthesis comprising: an upper roll chamber, a deposition chamber 20 connected to the upper roll chamber to deposit graphene on a catalytic metal film, and a lower roll chamber mounted on a lower portion of the deposition chamber, in which the upper roll chamber includes a supply roller supplying the catalytic metal film and a winding roller winding the catalytic metal film deposited with the graphene, the lower roll chamber includes a lower direction shifting roller shifting a direction of the catalytic metal film which is supplied from the supply roller, deposited with the graphene in the deposition chamber, and wound on the winding roller, and in the deposition chamber, a catalytic metal film at a supply side transferred from the supply roller to the lower direction shifting roller and a catalytic metal film at a discharge side transferred from the lower direction shifting roller to the winding roller are passed, and a heater portion is mounted around the catalytic metal film at the supply side and the catalytic metal film at the discharge side.

The upper roll chamber may include an upper roll chamber body, a supply roller provided inside the upper roll chamber to be driven by a motor, a first direction shifting roller provided at one side of the supply roller to shift the direction of the catalytic metal film supplied from the supply roller downward, an intermediate roller rotating in contact with the first direction shifting roller at one side of the first direction shifting roller, applying friction force so that the catalytic metal film is uniformly supplied to the lower direction shifting roller, and driven by the motor, a second direction shifting roller rotating in contact with the intermediate roller at one side of the intermediate roller and shifting a direction of the catalytic metal film transferred through the lower direction shifting roller, and a winding roller provided at one side of the second direction shifting roller to wind the catalytic metal film transferred through the second direction shifting roller, and driven by the motor. The intermediate roller may receive driving force from the motor provided outside the upper roll chamber body to transmit the driving force to the supply roller and the winding roller. The cooling water may be supplied to the intermediate roller to cool the catalytic metal film.

The deposition chamber may include a deposition chamber body formed integrally with an upper plate, a lower plate, and a side plate, door portions formed at both sides facing each other of the deposition chamber body to view the surface of the catalytic metal film, a heater provided inside the deposition chamber body and positioned between the supply-side catalytic metal film and the discharge-side catalytic metal film, a heater fixing side plate fixed with the heater and attached to the deposition chamber body, a shield frame fixed to the heater fixing side plate, and a heater portion provided in the shield frame to cover the periphery of the heater and reflect and block the heat from the heater.

A plurality of auxiliary rollers may be mounted on a lower plate of the deposition chamber body, a lower portion of the shield frame may be in contact with an upper portion of the plurality of auxiliary rollers, and when the heater fixing side plate is separated from the deposition chamber body, the auxiliary roller in contact with the shield frame may be rotated so that the heater portion is easily separated.

A shield may be formed inside the door.

The shield may be configured of a molybdenum plate close to the catalytic metal film and one or more stainless steel plates stacked at a predetermined distance from the rear surface of the molybdenum plate.

The lower roll chamber may include a lower roll chamber body, a lower direction shifting roller provided inside the lower roll chamber body, and a first friction roller and a second friction roller which are in contact with both sides of the lower direction shifting roller to give a direction and friction of the catalytic metal film direction-shifted in the lower direction shifting roller. The lower direction shifting roller may be a tension adjustment roller capable of adjusting the tension of the catalytic metal film.

Advantageous Effects

The present invention has an advantage of enhancing deposition efficiency by depositing a plurality of graphenes on a catalytic metal film in a deposition chamber by forming a supply roller and a winding roller in a upper roll chamber and forming a lower direction shift roller in a lower roll chamber.

Further, the present invention has an advantage of facilitating maintenance by easily separating a heater part in the deposition chamber from a deposition chamber body.

Further, the present invention has an advantage of facilitating maintenance by forming a door in the deposition chamber.

Further, the present invention has an advantage of easily blocking and reflecting heat by disposing a heater between the catalytic metal films and installing a shield around the catalytic metal film, thereby enhancing heat efficiency required for deposition.

Further, the present invention has an economic effect of reducing costs required for deposition by depositing both surfaces of the catalytic metal film by a heater.

Further, the present invention has an advantage of adjusting tension of the catalytic metal film by positioning both a supply roller and a winding roller in an upper roll chamber.

BEST MODE OF THE INVENTION

A best embodiment of the present invention provides a heat treatment apparatus for high-quality graphene synthesis comprising: an upper roll chamber, a deposition chamber 20 connected to the upper roll chamber to deposit graphene on a catalytic metal film, and a lower roll chamber mounted on a lower portion of the deposition chamber, in which the upper roll chamber includes a supply roller supplying the catalytic metal film and a winding roller winding the catalytic metal film deposited with the graphene, the lower roll chamber includes a lower direction shifting roller shifting a direction of the catalytic metal film which is supplied from the supply roller, deposited with the graphene in the deposition chamber, and wound on the winding roller, and in the deposition chamber, a catalytic metal film at a supply side transferred from the supply roller to the lower direction shifting roller and a catalytic metal film at a discharge side transferred from the lower direction shifting roller to the winding roller are passed, and a heater portion is mounted around the catalytic metal film at the supply side and the catalytic metal film at the discharge side.

Modes of the Invention

Hereinafter, a deposition chamber of a heat treatment apparatus for high-quality graphene synthesis will be described in detail with reference to the accompanying drawings.

Figure 1:
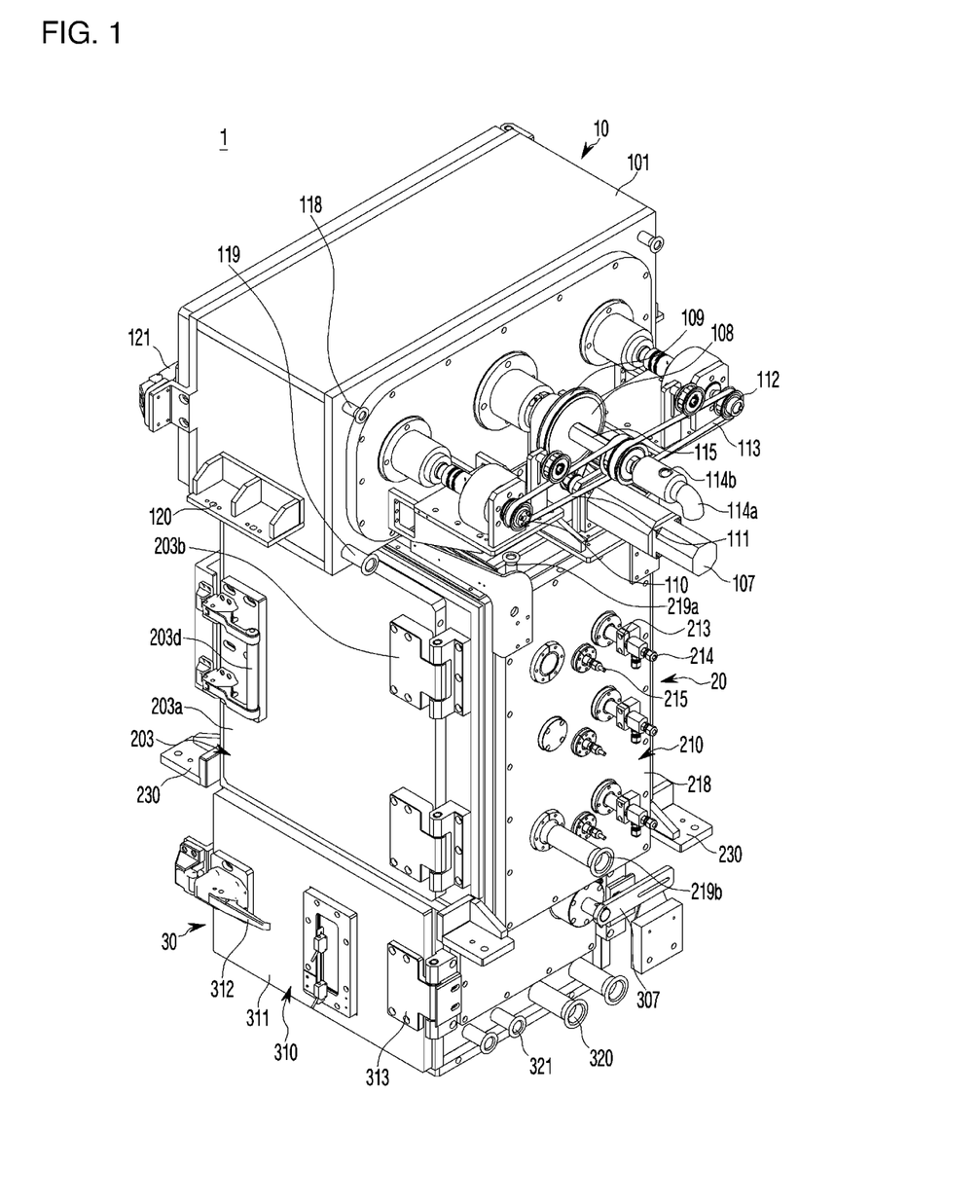
FIG. 1 is an overall perspective view of a heat treatment apparatus for high-quality graphene synthesis according to a preferred embodiment of the present invention.
Figure 2:
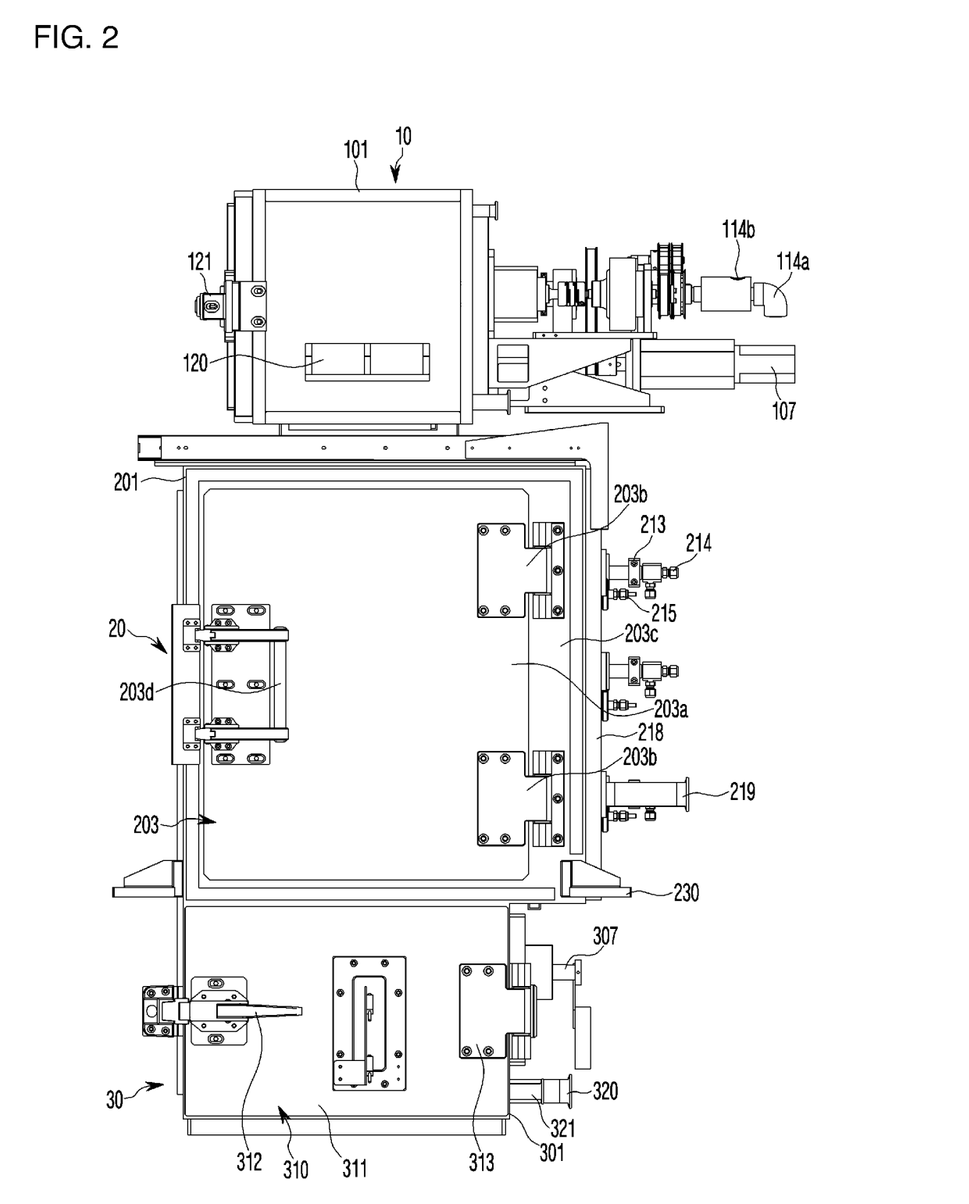
FIG. 2 is a side view of the heat treatment apparatus for high-quality graphene synthesis according to the preferred embodiment of the present invention.
Figure 3:
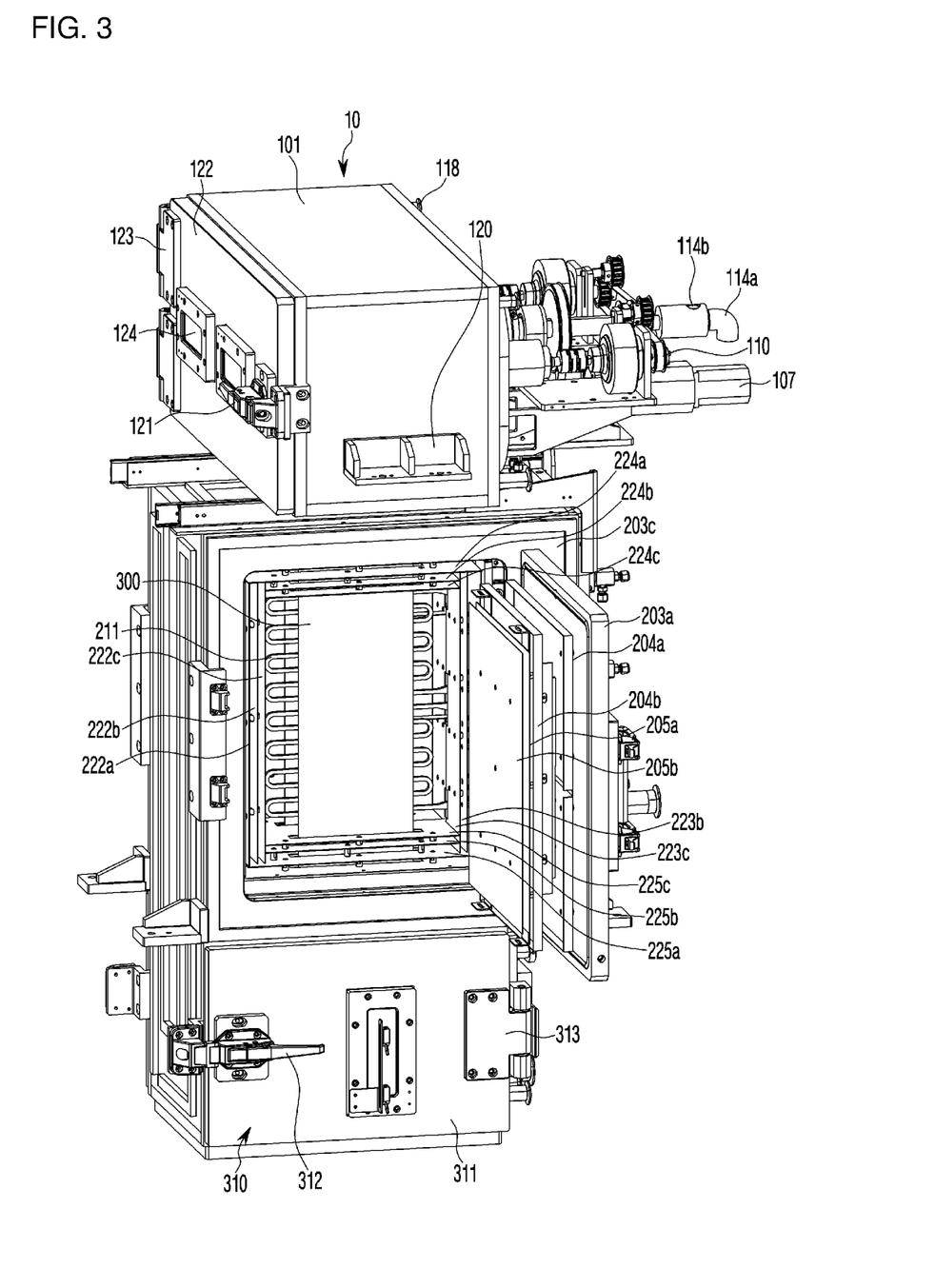
FIG. 3 is a side perspective view of an opened door of a deposition chamber according to the preferred embodiment of the present invention.
Figure 4:
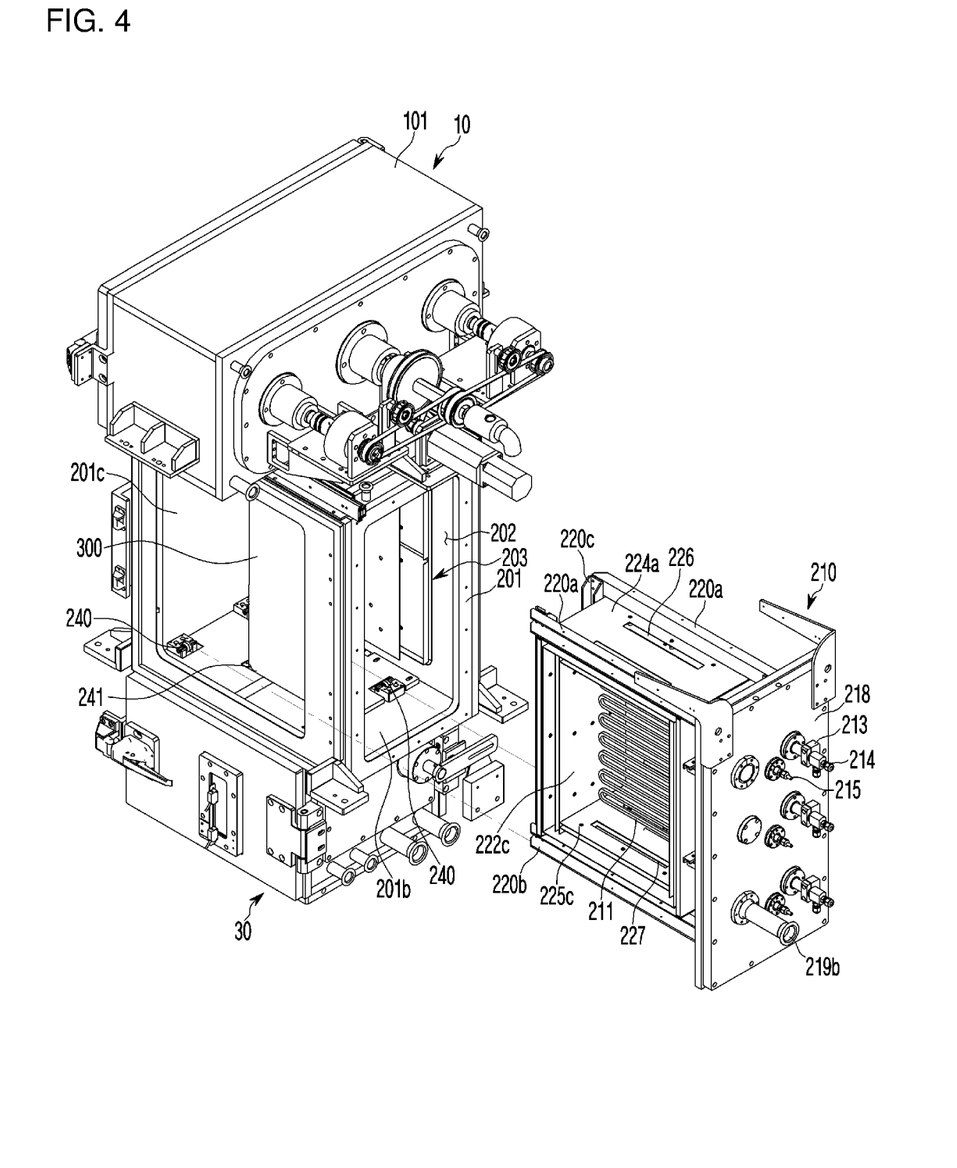
FIG. 4 is a perspective view of a state in which a heater part is removed from the deposition chamber of the present invention.
Figure 5:
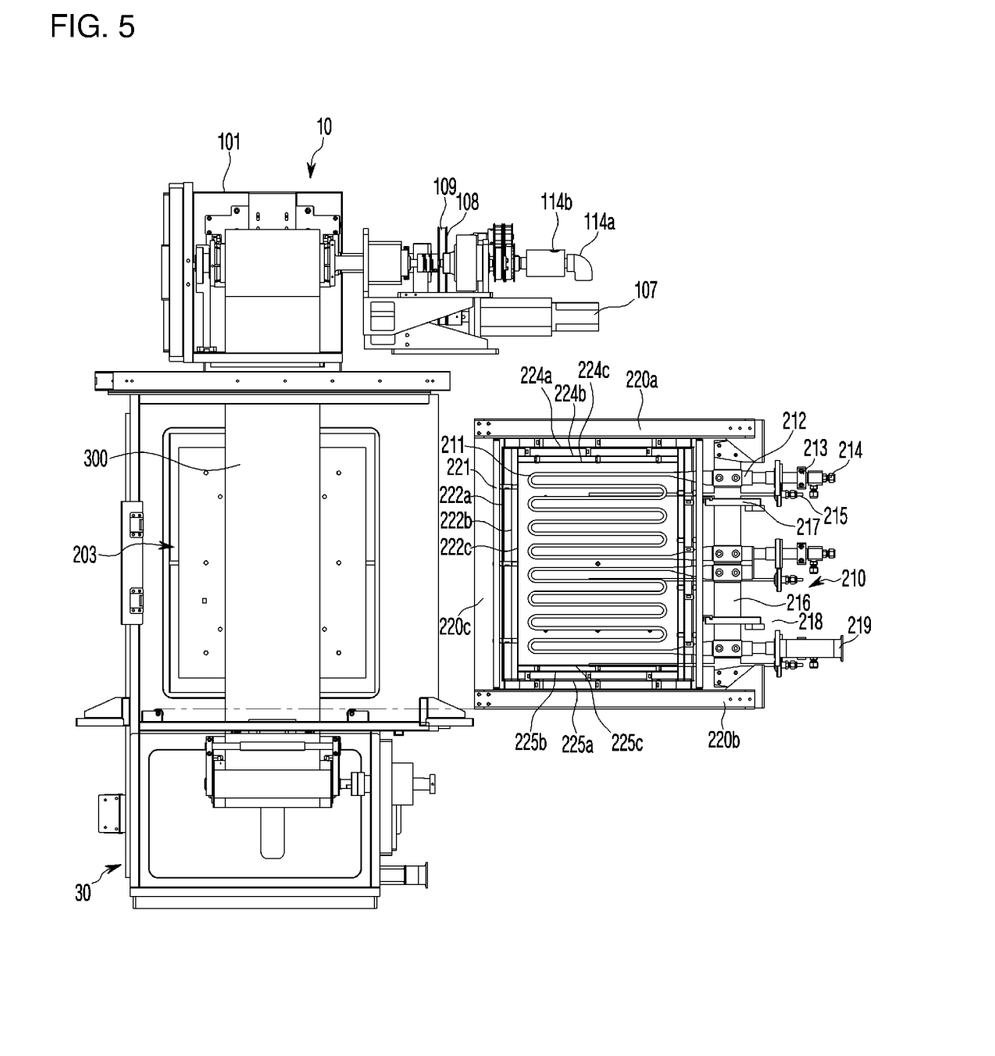
FIG. 5 is a side view of a state in which the door of the deposition chamber of the present invention is removed.
Figure 6:
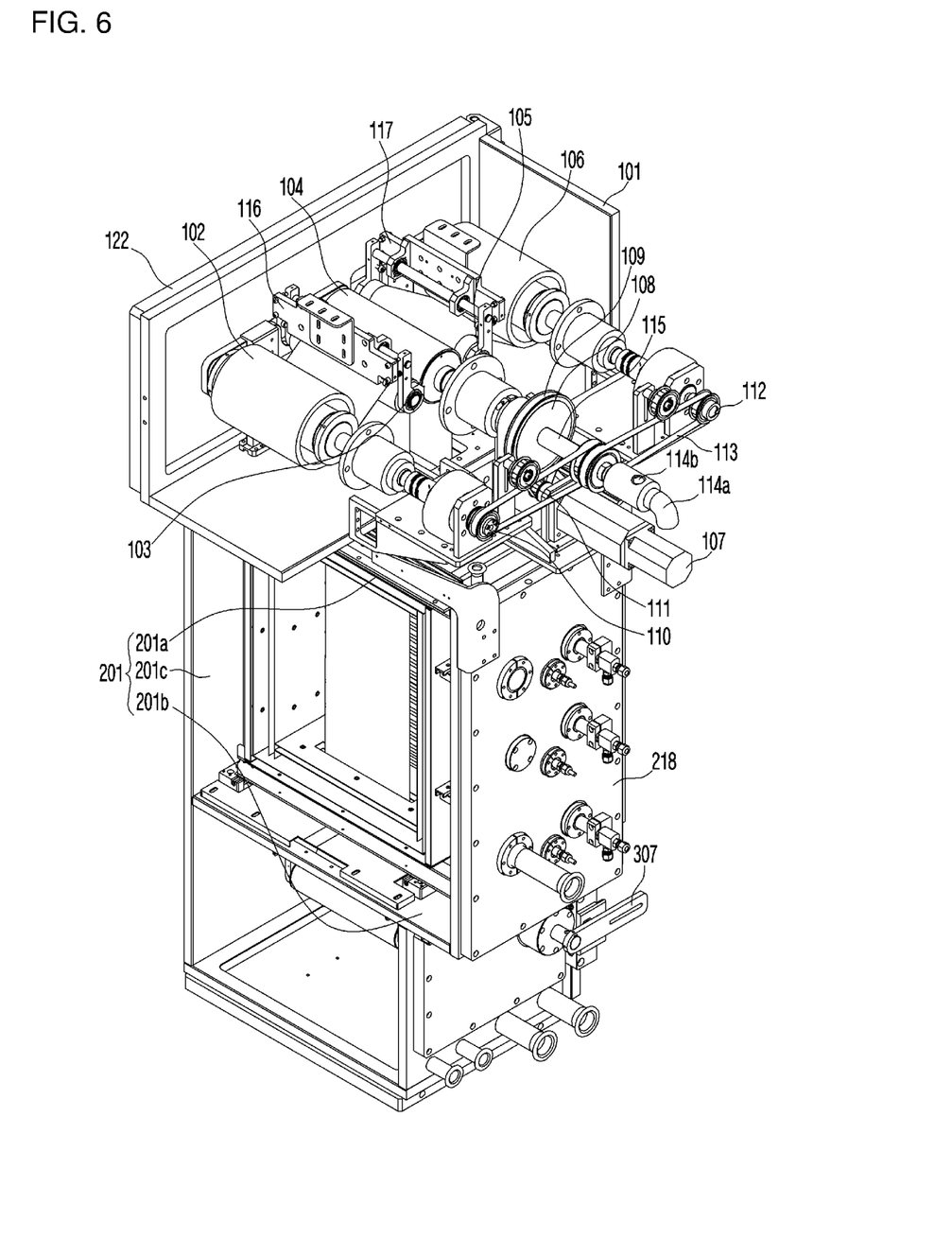
FIG. 6 is a partially removed perspective view of the heat treatment apparatus for high-quality graphene synthesis according to the preferred embodiment of the present invention.
Figure 7:
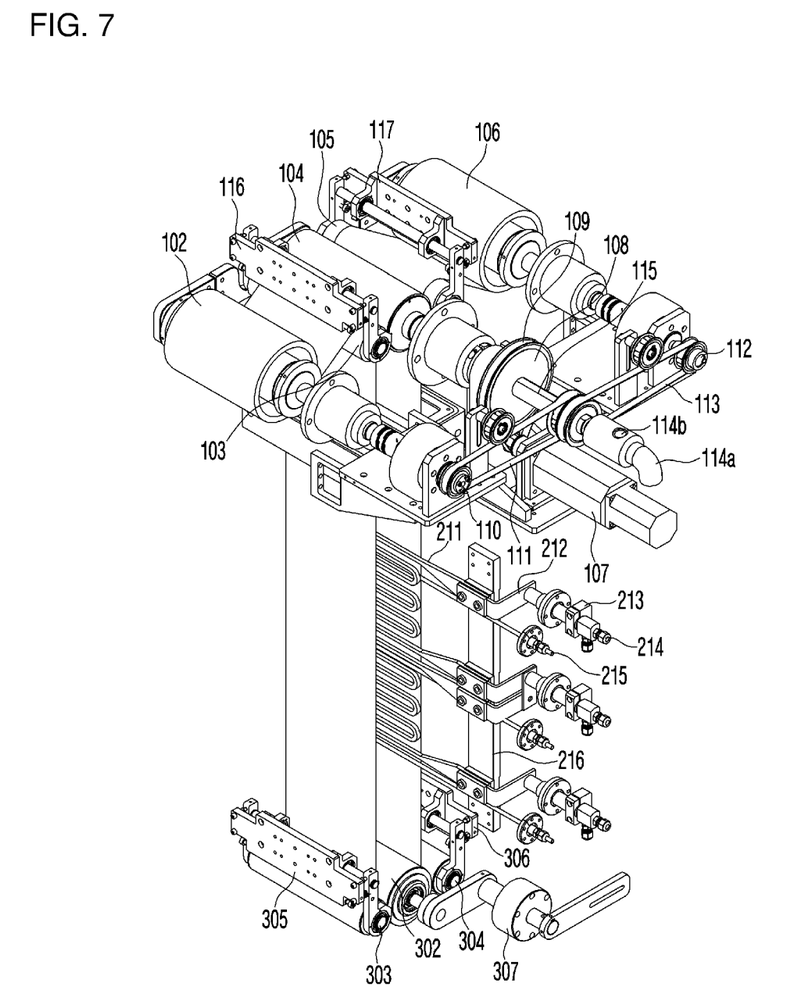
FIG. 7 is a perspective view of an inner roller of the heat treatment apparatus for high-quality graphene synthesis according to the preferred embodiment of the present invention.

FIG. 1 is an overall perspective view of a heat treatment apparatus for high-quality graphene synthesis according to a preferred embodiment of the present invention, FIG. 2 is a side view of the heat treatment apparatus for high-quality graphene synthesis according to the preferred embodiment of the present invention, FIG. 3 is a side perspective view of an opened door of a deposition chamber according to the preferred embodiment of the present invention, FIG. 4 is a perspective view of a state in which a heater part is removed from the deposition chamber of the present invention, FIG. 5 is a side view of a state in which the door of the deposition chamber of the present invention is removed, FIG. 6 is a partially removed perspective view of the heat treatment apparatus for high-quality graphene synthesis according to the preferred embodiment of the present invention, and FIG. 7 is a perspective view of an inner roller of the heat treatment apparatus for high-quality graphene synthesis according to the preferred embodiment of the present invention.

FIG. 1 is an overall perspective view of a heat treatment apparatus for high-quality graphene synthesis according to an embodiment of the present invention. As shown in FIG. 1, a heat treatment apparatus 1 for high-quality graphene synthesis is configured by an upper roll chamber 10, a deposition chamber 20 provided at the lower portion of the upper roll chamber 10, and a lower roll chamber 30 provided at a lower portion of the deposition chamber 20.

When describing the configuration of the upper roll chamber 10, the upper roll chamber 10 includes an upper roll chamber body 101, a supply roller drive shaft 110 for driving a supply roller 102 provided outside the chamber body 101, an intermediate roller drive shaft 115 for driving an intermediate roller 104 provided at one side of the supply roller 102, and a winding roller drive shaft 112 for driving a winding roller 106 provided at one side of the intermediate roller 104. A motor 107 is mounted on a lower portion of the intermediate roller 104, and the motor 107 is driven by being connected to a pulley 108 provided on the drive shaft 115 of the intermediate roller 104 by a belt 109 or a chain. The supply roller drive shaft 110 is driven by being connected from another pulley provided on the drive shaft 115 of the intermediate roller by the belt 111 and the winding roller drive shaft 112 is driven by being connected from another pulley provided in the drive shaft 115 of the intermediate roller by the belt 113. Each of the drive shafts may control a rotation speed of the rollers by providing a decelerator. The intermediate roller 104 may include a cooling means for cooling a catalytic metal film wound on the winding roller 106. The cooling means performs a method of cooling the catalytic metal film by circulating cooling water to the inside of the intermediate roller 104 and the cooling water is introduced through an inlet hole 114*a* and discharged through an outlet hole 114*b*. Further, a door 122 is provided on a front surface of the chamber body 101. A locking knob 121 is formed on the door 122 to be easily opened and closed.

The deposition chamber 20 is provided with a chamber body 201 and door portions 203 on opposite sides of the chamber body 201 so as to view the surface of the catalytic metal film 300. The door portion 203 includes a door 203*a*, a locking knob 203*d* for opening and closing the door 203*a*, and a hinge 203*b* provided so that the door 203*a* may be rotated. A detachable heater fixing side plate 218 is fixed to any side of the chamber body 201. If maintenance is required, the heater fixing side plate 218 may be removed from the chamber body 201 after screws for fixing the heater fixing side plate are removed.

The lower roll chamber 30 is provided at the lower portion of the deposition chamber 20 and a lower direction shifting roller 30 is provided with the lower roll chamber 30. The lower roll chamber 30 is provided with a chamber body 301 and a door portion 310 formed at one side of the chamber body 301 to maintain a roller inside the chamber. The door portion 310 is configured by a door 311, a locking knob 312 and a hinge 313 so that the door can be easily opened and closed by using the locking knob 312, and thus the maintenance of the internal roller is possible. Vacuum exhaust pipes 320 and 321 connected to a vacuum pump (not shown) for exhausting the inner vacuum are provided on the side surface.

FIG. 2 is a side view of the heat treatment apparatus 1 for the high-quality graphene analysis according to the present invention. As shown in FIG. 2, the upper roll chamber 10 is formed to attach a plurality of configurations to the chamber body 101 and a fixing lug 120 for fixing the chamber body 101 is attached to the outside of the chamber body 101.

The deposition chamber 20 is provided with the door portion 203 so that internal maintenance of the deposition chamber 20 is possible. In the door portion 203, the door 203*a*, the locking knob 203*d*, the hinge 203*b* and a door support plate 203*c* for fixing the door portion 203 are fixed to the chamber body 201 and the hinge 203*b* is mounted on the support plate 203*c* and the door 203*a* so that the door may be opened and closed by using the locking knob 203*d*.

The lower roll chamber 30 is also provided with a door portion 310. The door portion 310 is also constituted by a door 311, a locking knob 312 and a hinge 313, and the hinge 313 is mounted directly on the chamber body 301 so that the door 311 can be opened and closed using the locking knob 312.

FIG. 3 is a perspective view of a state in which the door portion 203 of the deposition chamber 30 is opened and closed in the heat treatment apparatus 1 for high-quality graphene synthesis according to the present invention. As shown in FIG. 3, a door is provided in the upper roll chamber 10, the locking knob 121 is attached to the door 122 to open and close the door, and the hinge 123 is mounted on the chamber body 101 and the door 122 to open and close the door 122.

A shield is provided inside the door portion 203 of the deposition chamber 20. The shield is composed of inner shields 205*a* and 205*b* provided on the inner side and outer shields 204*a* and 204*b* provided on the outer sides of the inner shields 205*a* and 205*b*. A heater portion 210 is inserted and fixed in the inner space of the chamber body. The heater portion 210 is provided with a shield at a remaining portion thereof except for the shield provided at the door portion 203.

FIG. 4 illustrates a state in which the heater portion 210 is removed from the deposition chamber 20. Since the heater portion 210 may be separated from the deposition chamber 20, the maintenance of the heater is possible, the replacement of the heater is easy, and workability is increased.

The heater portion 210 is provided with a heater 211, a heater fixing side plate 218 on which the heater is fixed and a shield fixed to the heater fixing side plate 218 to cover a periphery of the heater 211, and the shield is fixed to shield frames 220*a*, 220*b* and 220*c*. The shield frames 220 (220*a*, 220*b*, and 220*c*) are made of metal angles, and the shields other than the shield on the door potion 203 side are mounted on the metal angles. Specifically, upper shields 224 (224*a*, 224*b*, and 224*c*), lower shields 225 (225*a*, 225*b*, and 225*c*), front shields 221 and 222 in front of the heater fixing side plate 218, and rear shields 223 (223*a*, 223*b*, and 223*c*) provided on the heater fixing side plate 218 are provided in the shield frame 220. Catalytic metal film through holes 226 and 227 through which the catalytic metal film passes are vertically provided in the upper shield 224 and the lower shield 225. In the present invention, a pair of catalytic metal film through holes 226 and 227 needs to be provided because the catalytic metal film is diverted in the lower roll chamber 30 and passes through the deposition chamber 20 again.

In the heater fixing side plate 218, a process gas introduction pipe 215 for inserting process gas therein and a cooling water flow pipe 214 are formed. The cooling water flow pipe 214 is formed to prevent the damage to an operator such as a burn by transferring heat from the inside to the outside. The cooling water flow pipe 214 is configured by a horizontal cooling water supply pipe and a vertical cooling water discharge pipe. A vacuum exhaust pipe 219*b* for exhausting vacuum is provided.

An auxiliary roller 240 is provided on the upper portion of a lower plate 201*b* so as to easily separate the heater portion 210 from the inside of the deposition chamber 20. By providing a plurality of auxiliary rollers 240, the heater portion 210 may be easily separated. The auxiliary roller 240 rotates in contact with a lower side frame 220*b* of the shield frame.

FIG. 5 is a side view of the heater portion 210 in a separated state. As shown in FIG. 5, a heater 211 is fixed to a heater terminal 212 connected to a wire connector 213, the heater terminal 212 is fixed to a terminal supporter 216, and the terminal supporter 216 is fixed to the heater fixing side plate 218. Further, for insulating heat of the heater 211, one side of an insulating bracket 217 is connected with the shield 233 and the other side thereof is fixed to the heater fixing side plate 218. The terminal supporter 216 may be formed of stainless or graphite rods and needs to be insulated with silicon (SiC) to prevent electrical conduction. Further, the insulating bracket 217 is formed of silicon (SiC) to insulate heat and maximally block heat transfer. The heater portion 210 heats the inside of the deposition chamber at a temperature of 1000 to 1500° C. Preferably, the heater portion 210 heats the catalytic metal film 300 to a temperature of 1000 to 1500° C. near the front and rear surfaces of the catalytic metal film 300. Specifically, the shields 221, 222, 223, 224, and 225 are constituted by a molybdenum plate close to the catalytic metal film and one or more stainless steel plates stacked at a predetermined distance from the rear surface of the molybdenum plate. Further, the outermost stainless steel plate may be bent inward or outward to prevent deformation due to heat. Instead of the molybdenum plate, a metal having a high melting point may be used like molybdenum.

FIGS. 6 and 7 are views for the configuration of the inner roller. As shown in FIG. 6, the inner rollers are configured by a supply roller 102 inside the upper roll chamber 10, a first direction shifting roller 103 for shifting the direction of the catalytic metal film 300 supplied from the supply roller 102, an intermediate roller 104 for supplying the catalytic metal film by friction force by connecting the first direction shifting roller 103, and a second direction shifting roller 105 for supplying the catalytic metal film to the winding roller 106 by friction force by contacting the intermediate roller 104. The intermediate roller 104 rotates in contact with the first direction shifting roller 103 and the second direction shifting roller 105 at both sides, rotates downward at the first direction shifting roller 103 side by rotating in one direction and rotates upward at the second direction shifting roller 105 side. Cooling water for cooling the catalytic metal film 300 may be supplied to the inside of the intermediate roller 104. The cooling water is circulated through a cooling water inlet hole 114a and a cooling water outlet hole 114b. The first direction shifting roller 103 is fixed to a first supporter 116 mounted on the chamber body 101 and the second direction shifting roller 105 is fixed and rotated to a second supporter 117 mounted on the chamber body 101. Accordingly, the first direction shifting roller 103 and the second direction shifting roller 105 are not driven by themselves and rotate by rotational force of the intermediate roller 104. Therefore, the first direction shifting roller 103 and the second direction shifting roller 105 supply and discharge the catalytic metal film by friction force.

FIG. 7 is an operational view of a graphene manufacturing apparatus 1 according to the present invention. As shown in FIG. 7, the catalytic metal film 300 direction-shifted in the first direction shifting roller 103 through the supply roller 102 is supplied to the deposition chamber 20 side, and in the deposition chamber 20, the graphene is primarily deposited on the catalytic metal film 300 of the supply side and introduced into the lower direction shifting roller 302 mounted on the low roller chamber 30 and then direction-shifted, and introduced inside the deposition chamber 20 again. The catalytic metal film 300 at the discharge side has a change of being deposited with the graphene once more again and wound on the winding roller 106 through the first direction shifting roller 103. Therefore, it is possible to maximize the deposition efficiency through the two deposition processes, and to save the working time and reduce the cost because one heater may perform two depositions.

At both sides of the lower direction-shifting roller 302, a first friction roller 303 is mounted in contact with the supply side and a second friction roller 304 is mounted in contact with the discharge side so as to smoothly transfer the catalytic metal film 300. In the lower direction-shifting roller 302, a tension adjustment device 307 is mounted to apply optimal tension to the catalytic metal film 300. The first friction roller 303 is supported by a first friction roller support 305 mounted in the lower roll chamber 30 and the second friction roller 304 is supported by a second friction roller support 306.

The present invention is not limited to the embodiments, and it will be apparent to those skilled in the art that various modifications and variations can be made in the present invention without departing from the technical gist of the present invention.

Industrial Applicability

The present invention relates to a heat treatment apparatus for high-quality graphene synthesis, and more particularly, to a heat treatment apparatus for high-quality graphene synthesis capable of more effectively depositing graphene on a catalytic metal film, which is an invention having high industrial applicability.

The invention claimed is:

1. A heat treatment apparatus for high-quality graphene synthesis comprising:
   a top roll chamber, a deposition chamber connected to a lower portion of the top roll chamber to deposit graphene on a catalytic metal film, and a bottom roll chamber connected to a lower portion of the deposition chamber,
   wherein the top roll chamber includes
      a top roll chamber body,
      a supply roller provided inside the top roll chamber to be driven by a motor,
      a first direction shifting roller provided at one side of the supply roller to shift a direction of the catalytic metal film, the catalytic metal film being supplied from the supply roller downwards,
      an intermediate roller rotating in contact with the first direction shifting roller at one side of the first direction shifting roller, applying friction force so that the catalytic metal film is uniformly supplied to a third direction shifting roller, and driven by the motor,
      a second direction shifting roller rotating in contact with the intermediate roller at one side of the intermediate roller and shifting a direction of the catalytic metal film when the catalytic metal film is transferred through the third direction shifting roller, and
      a winding roller provided at one side of the second direction shifting roller to wind the catalytic metal film when the catalytic metal film is transferred through the second direction shifting roller, and driven by the motor,
   wherein the deposition chamber includes
      a deposition chamber body formed integrally with a top plate, side plates connected to the top plate and a bottom plate connected to side plates,
      door portions formed at both sides facing each other of the deposition chamber body to view a surface of the catalytic metal film,
      a heater portion comprising a heater provided inside the deposition chamber body and positioned between the catalytic metal film on a supply side and the catalytic metal film on a discharge side,
      a heater fixing side plate fixed with the heater and attached to the deposition chamber body,
      a shield frame fixed to the heater fixing side plate, and
      shields provided in the shield frame to cover a periphery of the heater and to reflect and block heat from the heater,
   wherein
      the bottom roll chamber includes
         a bottom roll chamber body, and
         a first friction roller and a second friction roller which are in contact with both sides of the third direction shifting roller to give a direction and friction to the catalytic metal film when the direction of the catalytic metal film is shifted in the third direction shifting roller, the third direction shifting roller being provided inside the bottom roll chamber body,
wherein the intermediate roller receives a driving force from the motor, the motor being provided outside the top roll chamber body to transmit the driving force to the supply roller and the winding roller,
wherein cooling water is supplied to the intermediate roller to cool the catalytic metal film, and
wherein
a plurality of auxiliary rollers is mounted on a bottom plate of the deposition chamber body,
a bottom of the shield frame is in contact with a top of the plurality of auxiliary rollers, and
when the heater fixing side plate is separated from the deposition chamber body, an auxiliary roller in contact with the shield frame is rotated so that the heater portion is removable from the deposition chamber body.

2. The heat treatment apparatus for high-quality graphene synthesis of claim 1, wherein a door portion shield is formed inside the door portions.

3. The heat treatment apparatus for high-quality graphene synthesis of claim 2, further comprising a plate shield formed of a molybdenum plate close to the catalytic metal film and one or more stainless steel plates stacked at a predetermined distance from a rear surface of the molybdenum plate.

4. The heat treatment apparatus for high-quality graphene synthesis of claim 1, wherein the third direction shifting roller is a tension adjustment roller capable of adjusting a tension of the catalytic metal film.

* * * * *